United States Patent [19]
Ulm, Jr. et al.

[11] Patent Number: 5,977,860
[45] Date of Patent: *Nov. 2, 1999

[54] SURFACE-MOUNT FUSE AND THE MANUFACTURE THEREOF

[75] Inventors: Steven Francis Ulm, Jr., Arlington Heights; Edwin James Harris, IV, Des Plaines; Matthew Michael Rybka, Chicago, all of Ill.

[73] Assignee: Littelfuse, Inc., Des Plaines, Ill.

[ * ] Notice: This patent is subject to a terminal disclaimer.

[21] Appl. No.: 08/804,421

[22] Filed: Feb. 21, 1997

Related U.S. Application Data

[63] Continuation-in-part of application No. 08/660,498, Jun. 7, 1996, Pat. No. 5,699,032.

[51] Int. Cl.⁶ .................................................... H01H 85/04
[52] U.S. Cl. ........................... 337/297; 337/227; 337/404
[58] Field of Search .................................. 337/152, 227, 337/228, 297, 404, 405; 29/623

[56] References Cited

U.S. PATENT DOCUMENTS

| | | | |
|---|---|---|---|
| 3,619,725 | 11/1971 | Soden et al. | 317/101 A |
| 4,120,558 | 10/1978 | Seidler | 339/275 |
| 4,140,988 | 2/1979 | Oakes | 337/279 |
| 4,164,725 | 8/1979 | Wiebe | 337/198 |
| 4,198,744 | 4/1980 | Nicolay | 29/623 |
| 4,203,648 | 5/1980 | Seidler | 339/275 |
| 4,356,627 | 11/1982 | Hoffman | 29/849 |
| 4,503,415 | 3/1985 | Rooney et al. | 337/160 |
| 4,514,718 | 4/1985 | Birx | 337/407 |
| 4,533,896 | 8/1985 | Beloposky | 337/232 |
| 4,540,969 | 9/1985 | Sugar | 337/232 |
| 4,547,830 | 10/1985 | Yamauchi | 361/104 |
| 4,605,278 | 8/1986 | Seidler | 339/275 |
| 4,612,529 | 9/1986 | Gurevich et al. | 337/255 |
| 4,626,818 | 12/1986 | Hilgers | 337/166 |
| 4,636,765 | 1/1987 | Krueger | 337/273 |
| 4,652,848 | 3/1987 | Hundrieser | 337/297 |
| 4,675,990 | 6/1987 | Viola et al. | 29/623 |
| 4,726,991 | 2/1988 | Hyatt et al. | 428/329 |
| 4,771,260 | 9/1988 | Gurevich | 337/231 |
| 4,788,626 | 11/1988 | Neidig et al. | 361/386 |
| 4,837,520 | 6/1989 | Golke | 324/550 |
| 4,851,806 | 7/1989 | Rohrer et al. | 337/231 |
| 4,873,506 | 10/1989 | Gurevich | 337/290 |
| 4,975,551 | 12/1990 | Syvertson | 200/144 |
| 5,084,691 | 1/1992 | Lester et al. | 337/297 |
| 5,095,297 | 3/1992 | Perreault et al. | 337/297 |

(List continued on next page.)

FOREIGN PATENT DOCUMENTS

| | | |
|---|---|---|
| 0270954 A1 | 6/1988 | European Pat. Off. . |
| 0581428 A1 | 2/1994 | European Pat. Off. . |
| 0626714 A1 | 11/1994 | European Pat. Off. . |
| 3530354 | 3/1987 | Germany . |
| 1604820 | 12/1981 | United Kingdom . |
| 2089148 | 6/1982 | United Kingdom . |
| WO 91/14279 | 9/1991 | WIPO . |

*Primary Examiner*—Leo P. Picard
*Assistant Examiner*—Jayprakash N. Gandhi
*Attorney, Agent, or Firm*—Wallenstein & Wagner, Ltd.

[57] ABSTRACT

A surface-mount fuse for protecting a circuit, which includes a substrate having first and second surfaces, each surface having first, second, third, and fourth ends, the substrate also having first, second, third, and fourth sides. The fuse includes a metal strip attached to the first surface of the substrate with a layer of adhesive material, the layer of adhesive material being disposed between the metal strip and the first surface of the substrate, the metal strip having a first connection region, a second connection region, and a non-linear fuse link therebetween. The fuse further includes first and second wire leads, the first wire lead being conductively connected to the first connection region and horizontally projecting away from the first connection region, the second wire lead being conductively connected to the second connection region and horizontally projecting away from the second connection region, for connecting the fuse to the remainder of the circuit. Alternatively, the wire leads can include clip leads or other terminal leads. The fuse also includes a protective layer disposed on the fuse link. A method for making the fuse is also disclosed.

43 Claims, 6 Drawing Sheets

U.S. PATENT DOCUMENTS

| | | | |
|---|---|---|---|
| 5,097,246 | 3/1992 | Cook et al. | 337/297 |
| 5,097,247 | 3/1992 | Doettwaechter | 337/405 |
| 5,102,506 | 4/1992 | Tanielian et al. | 205/118 |
| 5,115,220 | 5/1992 | Suuronen et al. | 337/297 |
| 5,140,295 | 8/1992 | Vermot-gaud et al. | 337/297 |
| 5,148,141 | 9/1992 | Suuronen | 337/297 |
| 5,155,462 | 10/1992 | Morrill, Jr. | 337/3 |
| 5,166,656 | 11/1992 | Badihi et al. | 337/297 |
| 5,228,188 | 7/1993 | Badihi et al. | 29/623 |
| 5,262,754 | 11/1993 | Collins | 338/21 |
| 5,296,833 | 3/1994 | Breen et al. | 337/297 |
| 5,309,625 | 5/1994 | Onishi | 29/623 |
| 5,340,775 | 8/1994 | Carruthers et al. | 437/246 |
| 5,363,082 | 11/1994 | Gurevich | 337/227 |
| 5,374,590 | 12/1994 | Batdorf et al. | 437/173 |
| 5,453,726 | 9/1995 | Montgomery | 337/290 |
| 5,699,032 | 12/1997 | Ulm, Jr. et al. | 337/297 |

SURFACE-MOUNT FUSE AND THE MANUFACTURE THEREOF

RELATED APPLICATION

This application is a continuation-in-part of U.S. patent application Ser. No. 08/660,498 filed on Jun. 7, 1996 now U.S. Pat. No. 5,699,032.

DESCRIPTION

TECHNICAL FIELD

The invention relates generally to a surface-mountable fuse for placement into and protection of the electrical circuit of a printed circuit board or other electrical circuit.

BACKGROUND OF THE INVENTION

Printed circuit (PC) boards have found increasing application in electrical and electronic equipment of all kinds. The electrical circuits formed on these PC boards, like larger scale, conventional electrical circuits, need protection against electrical overloads. In particular, circuit boards and other electrical circuits within the telecommunications industry need protection against electrical overload. This protection can be provided by subminiature fuses that are physically secured to the PC board.

One example of such a subminiature, surface-mount fuse is disclosed in U.S. Pat. No. 5,166,656 (the "'656 patent"). The fusible link of this surface-mount fuse is covered with a three layer composite which includes a passivation layer, an insulating cover, and an epoxy layer to bond the passivation layer to the insulating cover. See '656 patent, column 6, lines 4–7. Typically, the passivation layer is either chemically vapor-deposited silica or a thick layer of printed glass. See '656 patent, column 3, lines 39–41. The insulating cover may be a glass cover. See '656 patent, column 4, lines 43–46. The fuse from the '656 patent has three layers protecting its fusible link. In addition, the fuse from the '656 patent has relatively thick glass covering. There are several other features in the '656 patent fuse which are unnecessary in the present invention.

One additional previous fuse is disclosed in European Patent Application No. 270,954. This "chip-type" fuse includes a conducting member 3 and electrodes 4a and 4b that wrap around an insulating member. The electrodes are not unitary with the conducting member, however, and the connection to the circuit board takes place on the lower surface of the substrate. In addition, several steps are required to create the electrodes. Furthermore, the protecting member is spread across the entire upper surface of the fuse. This fuse includes several other disadvantages.

The present invention is designed to solve these and other problems.

SUMMARY OF THE INVENTION

The present invention is a surface-mount fuse for protecting a circuit including the fuse. The fuse includes a substrate having first and second surfaces, each surface having first, second, third, and fourth ends, the substrate also having first, second, third, and fourth sides. The fuse also includes a metal strip evenly attached to the first surface of the substrate with a layer of adhesive material, the layer of adhesive material being disposed between the metal strip and the first surface of the substrate. The metal strip has a first connection region, a second connection region, and a non-linear fuse link therebetween. The fuse link has an upper surface and a side surface, and the first connection region is disposed along substantially the full length of the first end of the first surface of the substrate, the second connection region being disposed along substantially the full length of the second end of the first surface of the substrate. One form of the invention further includes first and second wire leads aligned substantially with and along the first and second connection regions, respectively. The first wire lead is conductively connected to the first connection region and horizontally projects away from the first connection region. The second wire lead is conductively connected to the second connection region and horizontally projects away from the second connection region for connecting the fuse to the remainder of the circuit.

The fuse also includes a protective layer that is disposed on the fuse link, with the protective layer in contact with and surrounding the upper and side surfaces of the fuse link of the metal strip, and can be disposed on at least a fraction of the first and second connection regions of the metal strip. A solder material is disposed between the first and second wire leads and the first and second connection regions, respectively, of the metal strip for connecting the first and second wire leads to the first and second connection regions. The metal strip is made from a zinc alloy, and can be applied through a sheet of zinc foil.

The present invention can also include the use of a metal strip evenly attached to the first surface of the substrate with a layer of polymeric material. The layer of polymeric material has first and second surfaces, each respectively having an adhesive material attached thereto. The layer of polymeric material is disposed between the metal strip and the first surface of the substrate. The adhesive material on the first surface of the layer of polymeric material connects the substrate to the first surface of the layer of polymeric material, and the adhesive material on the second surface of the layer of polymeric material connects the metal strip to the second surface of the layer of polymeric material.

In lieu of the polymeric material with two sides having adhesive coatings, it has been found preferable to use a two-part adhesive coating. Particularly, it has been found that a silicone, laminating adhesive permits shorter curing times and lower curing temperatures. This, in turn, reduces and substantially eliminates the occasional warping of larger size sheets when using the substrate-polymeric layer-adhesive composite described in the above paragraph.

A first terminal lead can be used instead of the first wire lead, and a second terminal lead can be used instead of the second wire lead. Furthermore, these terminal leads can take the form of clip leads, as will be described in detail below.

The present invention also includes the method of manufacture of the fuse. The method of manufacture uses a lamination step for laminating the substrate, the layer of adhesive material, and the sheet of metal to form a unitary laminated sheet having a metal surface and a substrate surface.

Alternative embodiments of the present invention may use alternative methods of manufacture, depending on the fuse being created, as will be described in detail below.

DETAILED DESCRIPTION OF THE PREFERRED EMBODIMENT

This invention may take the form of many different embodiments. This disclosure exemplifies the principles of the invention. The attached drawings and specification describe preferred embodiments of the invention, and are not intended to limit the patent to the illustrated embodiments.

Figure 9:
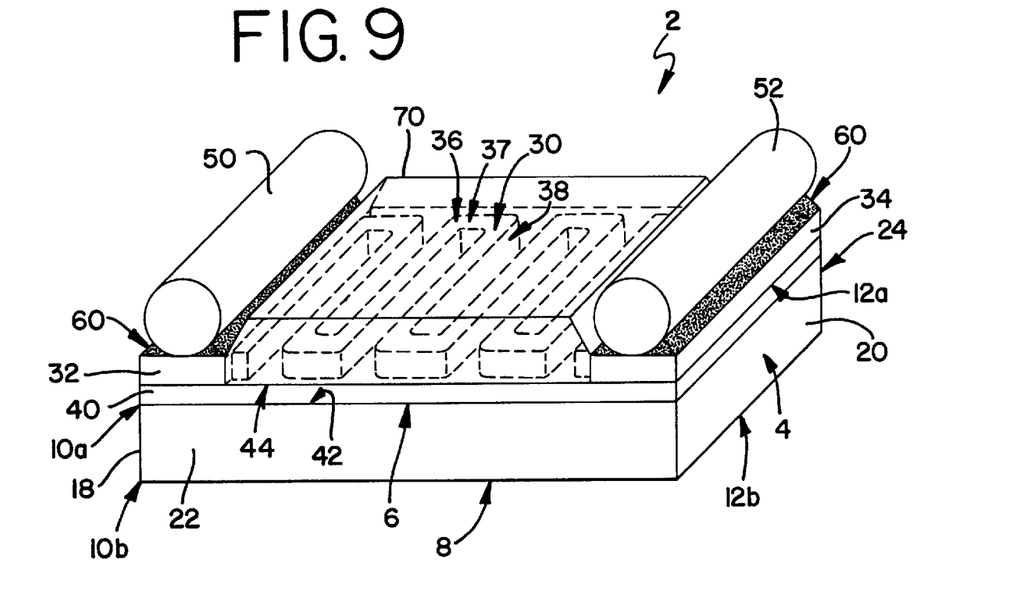
FIG. 9 is a perspective view of one surface-mount fuse in accordance with the present invention.
Figure 10:
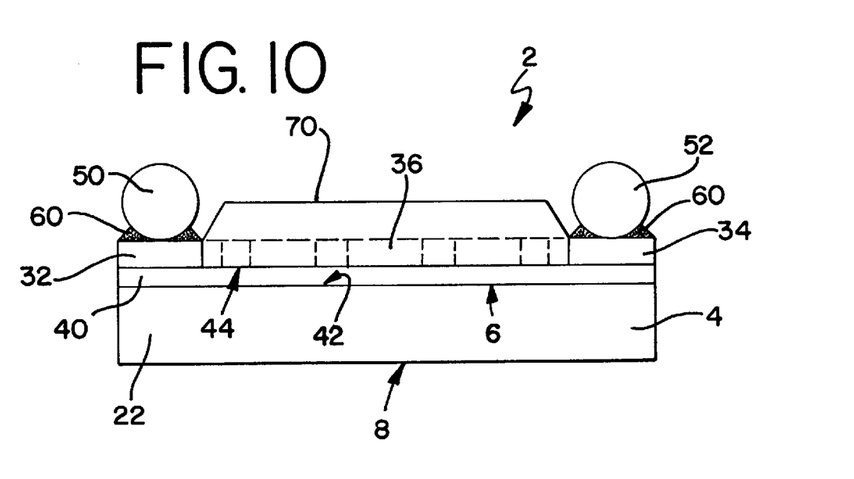
FIG. 10 is a side view of the view of FIG. 9.

One preferred embodiment of the present invention is shown in FIGS. 9 and 10, and portions of this embodiment used to make the surface-mount fuse 2 are shown in FIGS. 1–9. It has been the goal for this and other disclosed fuses to be generally capable of withstanding 600 volt power cross and lightening spikes, as well as UL Standard 1459 and 1950 and Belcore 1089, although not necessary for the practice of the present invention. In addition, it has initially been a goal to create fuse ratings from about 0.25 (or lower) to about 1.50 amps, although the specific concepts of this invention also apply to fuses with higher ratings.

Referring to these FIGURES, the surface-mount fuse 2 is generally used for protecting a circuit when the circuit includes the fuse 2. The fuse 2 includes a substrate 4 which can be an FR-4 material, a melamine-based composition, a polyimide, ceramic, or other material having similar insulating properties. For example, the FR-4 epoxy sheet is available as Spauldite® NEMA type FR-4 epoxy laminate, having a thickness of 0.035". This product is available from the Spaulding Fibre Company, Inc., One American Drive, Buffalo, N.Y. 14225. An example of a suitable melamine substrate is available as Spauldite® NEMA type G-5 melamine laminate, having a thickness of 0.035". This product is available from the Spaulding Fibre Company, Inc., One American Drive, Buffalo, N.Y. 14225.

The substrate 4 has a first surface 6 and second surface 8. Each surface 6, 8 has a first end 10a, 10b, a second end 12a, 12b, a third end 14a, 14b, and a fourth end 16a, 16b. The substrate also has a first side 18, a second side 20, a third side 22, and a fourth side 24. The fuse 2 also includes a metal strip 30 that is evenly attached to the first surface 6 of the substrate 4 with a layer of adhesive material 40. This adhesive is preferably non-flammable and non-conducting, and capable of withstanding high temperatures. The layer of adhesive material 40 is disposed between the metal strip 30 and the first surface 6 of the substrate 4 for attaching the metal strip 30 to the substrate 4. The adhesive 40 also acts as a thermal barrier between the substrate 4 and the metal strip 30.

The metal strip 30 has a first connection region 32, a second connection region 34, and a non-linear fuse link 36 therebetween. The fuse link 36 of the metal strip 30 has an upper surface 37 and a side surface 38. The first connection region 32 is disposed or located along substantially the full length of the first end 10a of the first surface 6 of the substrate 4, with the adhesive 40 therebetween. The second connection region 34 is disposed or located along substantially the full length of the second end 12a of the first surface 6 of the substrate 4. The metal strip is preferably made from a zinc alloy, but can also be made from copper and aluminum alloys, or other metals which provide the necessary characteristics for the particular application. Additionally, tin or a tin-lead alloy, or other metal, can be placed or deposited on the fuse link 36 of the metal strip 30 to create or enhance the M-effect. It should be understood by those skilled in the art that other conductive metals may be placed on the fuse link 36 to lower its melting temperature. In addition, this deposit need not be of any particular shape, but can take on any number of configurations. Further, nickel, tin, tin-lead alloy, or other metal, can also be placed or deposited on the connection regions 32, 34 of the metal strip 30 to enhance solderability. This is performed because zinc alone (the metal strip 30) tends to migrate and cause problems with the solder 60.

The fuse 2 of the embodiment in FIGS. 9 and 10 also has a first wire lead 50 and a second wire lead 52. The first wire lead 50 is aligned substantially with and along the first connection region 32, and the second wire lead 52 is aligned substantially with and along the second connection region 34. The first wire lead 50 is conductively connected to the first connection region 32 with the use of a solder material 60 (high temperature solder joint). The solder material 60 is disposed between the first and second wire leads 50, 52 and the first and second connection regions 32, 34, respectively, for connecting the first and second wire leads 50, 52 to the first and second connection regions 32, 34. The first wire lead 50 projects horizontally away from the first connection region 32. The second wire lead 52 is, likewise, conductively connected to the second connection region 34 with the use of the solder material 60. The second wire lead 52 also projects horizontally away from the second connection region 34. The first and second wire leads 50, 52 are provided for connecting the fuse 2 to the remainder of the circuit. Additionally, nickel or other coating/plating, such as a tin or tin-lead alloy, can be deposited on the wire leads/terminal leads 50, 52 or 50', 52'.

The surface-mount fuse 2 further includes a protective layer 70 that is disposed or deposited onto the fuse link 36.

The deposited protective layer 70 contacts and surrounds the upper and side surfaces 37, 38 of the fuse link 36 of the metal strip 30. The protective layer 70 can also contact at least a fraction of the first and second connection regions 32, 34 of the metal strip 30, although it is preferable for the protective layer 70 not to overlap onto the connection regions 32, 34. It is, however, preferable for the protective layer 70 to cover substantially all of the fuse link 36, and come close to the connection regions 32, 34.

The protective layer 70 can be made of a polymeric material, an RTV material, or other material with similar characteristics. The preferred material is, however, an RTV silicone supplied by GE Silicone, Part No. RTV-162. Other similar gels, pastes, or adhesives are suitable for the invention as well. In addition to polymers, the protective layer 70 may also be comprised of plastics, conformal coatings, and epoxies.

The protective layer 70 (a) protects the fuse 2 and fuse link 36 from impacts which may occur during automated assembly; (b) protects the fuse 2 from oxidation during use; (c) prevents electrical arcing; and (d) protects against other environmental concerns.

The protective layer 70 forms a relatively tight seal over the fuse link 36. As a result, the protective layer 70 inhibits corrosion of the fuse links 36 during their useful lives.

In addition, this protective layer 70 helps to control the melting, ionization and arcing which occur in the fuse link 36 during current overload conditions. The protective layer 70 or cover coat material provides desired arc-quenching characteristics, especially important upon interruption of the fuse link 36.

Figure 12:
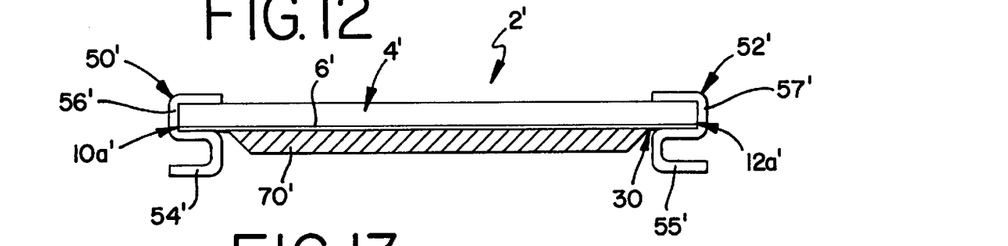
FIG. 12 is a side view of the surface-mount fuse from FIG. 11.

The protective layer 70 can be clear and colorless for viewing the fuse link 36, although the fuse link 36 will typically be facing toward the circuit board during use. There are significant advantages, however, in having the metal strip 30 side of the fuse 2 facing toward the circuit board. Specifically, the second surface 8 of the substrate 4 can be used to mark the fuse 2, as is generally shown in FIG. 12, with prime designations. In addition, since the second surface 8 or top surface of the substrate 4 is substantially flat, pick and place machines that are used to manufacture circuit boards can utilize the flat surface of the second surface 8 of the substrate 4 to pick and place the fuse 2 into a circuit board.

As a variation of the embodiment shown in FIGS. 9 and 10, the metal strip 30 is attached to the first surface 6 of the substrate 4 with the use of a layer of polymeric material 40. The layer of polymeric material 40 has a first surface 42 and second surface 44, each surface 42, 44 has an adhesive material attached thereto. The layer of polymeric material 40 is disposed or positioned between the metal strip 30 and the first surface 6 of the substrate 4. The adhesive material on the first surface 42 of the layer of polymeric material 40 connects or attaches the substrate 4 to the first surface 42 of the layer of polymeric material 40. Likewise, the adhesive material on the second surface 44 of the layer of polymeric material 40 connects or attaches the metal strip 30 to the second surface 44 of the layer of polymeric material 40. A lamination process can be used to perform the attachment during manufacture, as will be described in detail further below. The layer of polymeric material 40 is preferably a polyimide such as KAPTON polyimide material, when used. In use, this polyimide layer is typically about 1 mil thick, but can go up to about 15 mils thick. KAPTON polyimide material can be obtained from DUPONT Corporation. The KAPTON polyimide provides a thermal barrier between the metal strip 30 and the substrate 4 and thus protects the substrate 4 from excessive heat. KAPTON polyimide has an operating temperature of around 250° C., while the operating temperature of a substrate such as the FR-4 material is around 150° C.

The inventors have found a preferred alternative to the use of a KAPTON polyimide, with two adhesive layers on its opposite faces, as a means of adhering the metal sheet to the substrate. Rather than using a KAPTON polyimide or other polymeric carrier for the adhesive, the adhesive may be placed directly onto the substrate. The zinc metal sheet is then placed over the adhesive, and the structure cured.

Figure 15:
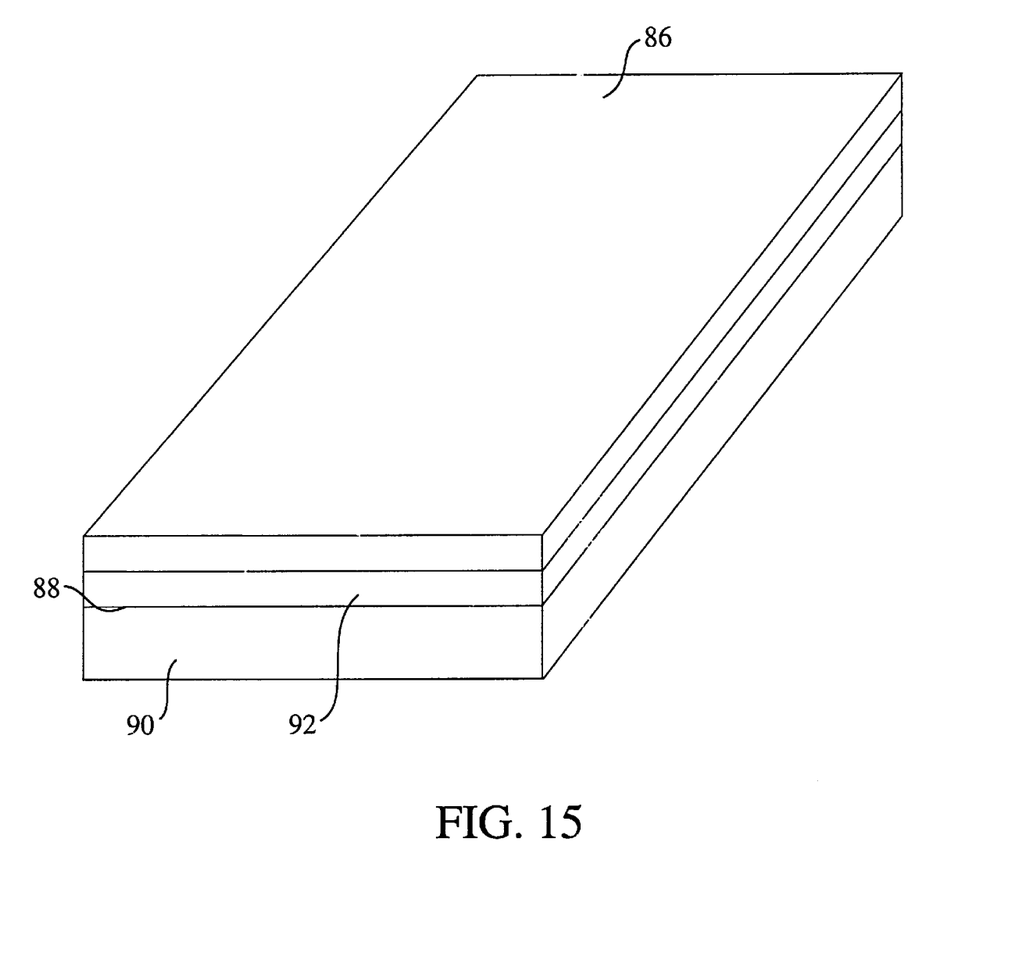
FIG. 15 is a perspective view of a substrate, a sheet of metal, and an alternate means of providing a layer of adhesive material between the substrate and metal, which composite structure is used to make a surface-mount fuse in accordance with the present invention.

Particularly, it has been found preferable to use a silicone laminating adhesive between the metal layer and the substrate. This alternative is shown in FIG. 15. In FIG. 15, the metal layer or strip 86 is attached to the first surface 88 of the substrate 90 with the use of a layer of adhesive 92, preferably a layer of silicone laminating adhesive. The layer of silicone laminating adhesive 92 is disposed or positioned between the metal layer or strip 86 and the first surface 88 of the substrate 90.

The preferred adhesive is silicone laminating adhesive available from GE Silicones, Waterford, N.Y., Product No. SLA7401-D1. SLA7401-D1 is a silicone laminating adhesive that is a translucent, paste-like, two component product. The metal layer or strip 86 is secured to the substrate 90 as follows. The separate parts of the two component product are put into adjacent, parallel tubes of a syringe. A plunger moves each of the components downward into the static mixing needle, where stationary baffles swirl the two components together so that they will be thoroughly blended.

The blended silicone laminating adhesive has a very high viscosity at room temperature. Therefore, a manual dispensing gun or a pneumatic dispensing apparatus is necessary to apply the blended adhesive.

A screen printer is used to apply the adhesive to the substrate 90. The screen printer includes a fine mesh screen that is a component of a pivoting tool positioned above the substrate 90. The preferred screen mesh in the present application is 80 mesh, with a wire diameter of 2 millimeters. Other screen meshes can be used, however, and the size of the mesh is a factor in the ultimate thickness of the adhesive layer 92 on the substrate 90. The screen mesh may range from at least 60–150 mesh.

A portion of the screen is masked. In this way, passage of the adhesive onto the substrate 90 below is limited to the unmasked portion of the screen. As a result, the shape of the unmasked portion of the screen can be changed according to the needs of the user. Accordingly, the unmasked portion of the screen dictates the shape and cross-sectional area of the adhesive layer 92 on the substrate 90.

In the present embodiment, a 12" by 18" area is left unmasked, except for a thin strip of masking at the center, dividing this area into two 6" by 18" sections.

After the screen is lowered over the substrate 90, the manual dispensing gun or a pneumatic dispensing apparatus applies the blended adhesive to the top of the screen. The adhesive is applied in linear, parallel, spaced-apart lines or beads from one end to another across the surface of the screen. These linear beads are spaced from each other at intervals of perhaps 1½" to 2". Below the screen, aligned with the unmasked portion of the screen, is the substrate 90. After the beads of adhesive are placed across the screen, a squeegee is wiped across these beads and the entire surface of the screen. In this way, the adhesive is forced through the screen mesh, and spread evenly across the surface of the substrate 90 in a layer of substantially uniform thickness.

The screen is then raised to a position away from the substrate 90. Because of the masking of the screen, the adhesive is placed on two sections of the substrate 90, each section being rectangular and approximately 6" by 18" in dimension. Two rectangular zinc sheets 86 having corresponding 6" by 18" dimensions are then aligned over and placed upon the corresponding adhesive-covered part of the single substrate 90. A roller is utilized to press the zinc sheet 86 to the substrate 90, and the rolling action removes air bubbles that may form in the adhesive. The rolling action need not be firm, but merely sufficient to apply a light and uniform pressure to the top of the zinc sheet 86 surface.

The zinc adhesive substrate composite is then placed into platens and a hot press, where it is subjected to between 100–200 psi, and cured at 150° C. for 15 minutes.

It has been found that structures made with this silicone-based adhesive provide the finished fuse with superior arc-quenching characteristics.

After the composite has been cured, it is etched by photolithography, in a manner well known in the art, to achieve the appropriate etching pattern.

Figure 11:
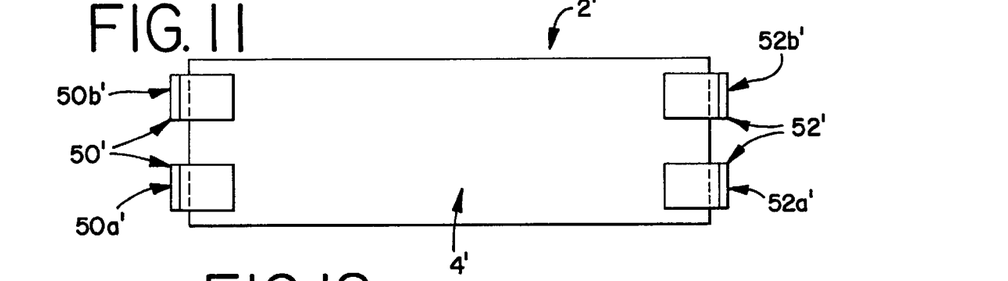
FIG. 11 is a bottom view of an additional embodiment of the surface-mount fuse from FIGS. 1–10, showing a 1.50 amp rating for this particular embodiment.
Figure 13:
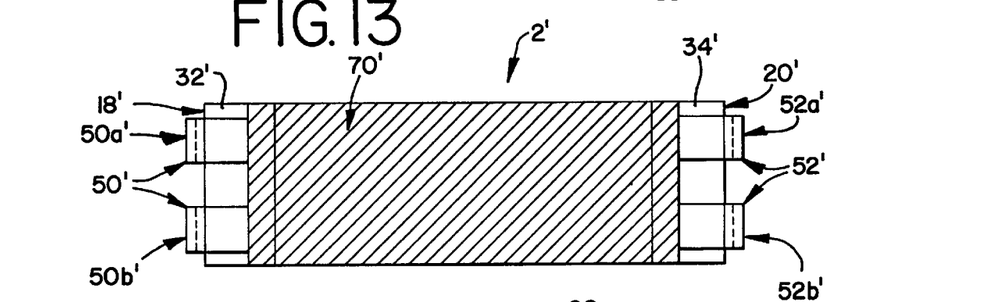
FIG. 13 is a top view of the surface-mount fuse from FIG. 11.

As an additional variation of the embodiment shown in FIGS. 9 and 10, the first and second wire leads 50, 52 need not be wire leads or terminals leads 50, 52 that have a similar shape, as shown. Rather, many other types of terminal leads can be used in place of those shown in FIGS. 9 and 10. In particular, one such variation is shown in FIGS. 11–13. In the fuse 2' of this additional embodiment, the first connection region 32' is disposed along substantially the full length of the first end 10a' of the first surface 6' of the substrate 4', and the second connection region 34' is disposed along substantially the full length of the second end 12a' of the first surface 6' of the substrate 4'. The terminal leads 50, 52 are, instead, first and second clip leads 50', 52', respectively. As shown in FIGS. 11 and 13, the first clip lead 50' can have a plurality of clips 50a', 50b' (preferably two clips) that can be integrally attached to one another, although each clip lead can be one integral clip. As shown in FIG. 12, each clip 50a', 50b' of the first clip lead 50' has a mounting portion 54', and a wrap-around portion 56'. The wrap-around portion 56' of the clips 50a', 50b' are aligned generally along the first connection region 32' and the first side 18' of the substrate 4', and are conductively connected to the first connection region 32'. The wrap-around portions 56' of the clips 50a', 50b' function to fasten the first clip lead 50' to the substrate 4' and first connection region 32'. The mounting portions 56' of the first clip lead 50' project away from the first connection region 32'. Likewise, the second clip lead 52' has a plurality of clips 52a', 52b', and can be integrally attached to one another. Each clip 52a', 52b' of the second clip lead 52' has a mounting portion 55' and a wrap-around portion 57'. The wrap-around portion 57' of the clips 52a', 52b' are aligned generally along the second connection region 34' and the second side 20' of the substrate 4', and are conductively connected to the second connection region 34'. The wrap-around portion 57' of the clips 52a', 52b' fasten the second clip lead 52' to the substrate 4 and the second connection region 34'. The mounting portion 55' of the second clip lead 52' projects away from the second connection region 34'. As such, the first and second clip leads 50', 52' connect the fuse 2' to the remainder of the circuit.

The non-linear form of the fuse link 36 allows for variation of the fuse rating. Specifically, by varying the thickness, width (cross-sectional area), and length of the fuse link 36 and metal strip 30, the rating can be increased or decreased. As shown in FIGS. 9 and 10, the fuse link 36 has a serpentine, or back and forth, configuration which increases the length of the fuse link 36 from an otherwise linear fuse link extending directly across the fuse. By using a serpentine configuration, the effective length of the fuse link 36 may be increased, even though the distance between the leads (terminals) at the opposite ends of that link remain the same. In this way, a serpentine configuration provides for a longer fuse link 36 without increasing the dimensions of the fuse itself.

The fuses 2, 2' from FIGS. 9–13 are manufactured from following general methods of manufacture, and each fuse 2, 2' has variations depending on the specific embodiment being manufactured. For reference purposes and a general understanding of manufacturing processes for surface-mount fuses and other surface-mountable devices, U.S. patent application Ser. Nos. 08/472,563, 08/482,829, 08/474,940 and 08/474,502 are incorporated herein by reference. In addition, for the purposes of this specification, the numbering in FIGS. 9 and 10, and 11–13 with a prime designation, that refer to a single fuse also apply to the overall substrate and layers from which a plurality of fuses are derived, as shown in FIGS. 1–8. As such, the method of the present invention includes manufacturing a plurality of surface-mount fuses 2, 2' from a single substrate 4.

Turning to FIGS. 1–8, the method begins with providing a substrate 4 having first and second surfaces 6, 8, and having first, second, third, and fourth sides 18, 20, 22, 24. For reference, FIGS. 3–8 all show ". . ." designations which signify that the plane of the overall substrate extends further in those directions. The beginning substrate 4 is typically about 12" by 18". The method also includes providing an adhesive, and laying the adhesive across substantially the entire first surface 6 of the substrate 4 to form a layer of adhesive material 40.

Figure 1:
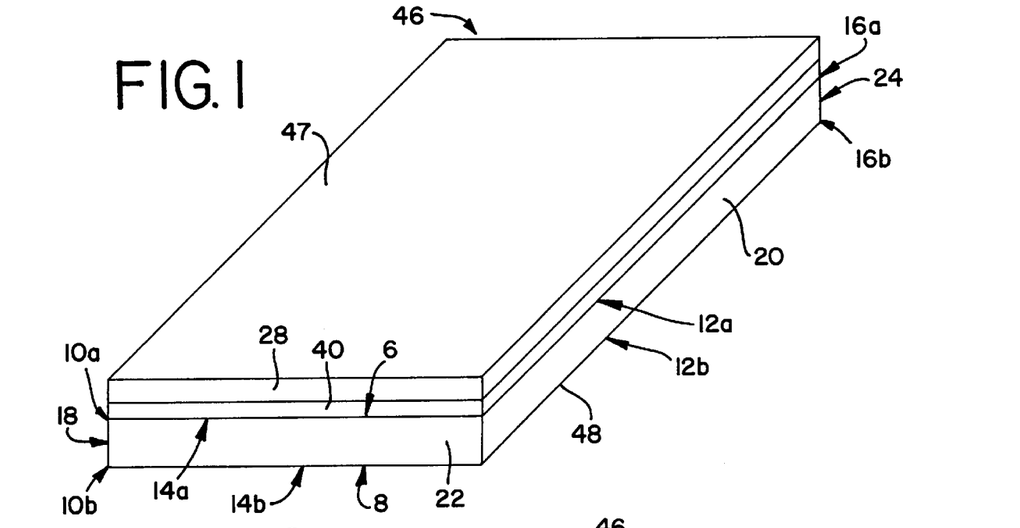
FIG. 1 is a perspective view of a substrate, a sheet of metal, and a layer of adhesive material therebetween, used to make a surface-mount fuse in accordance with the present invention.
Figure 2:
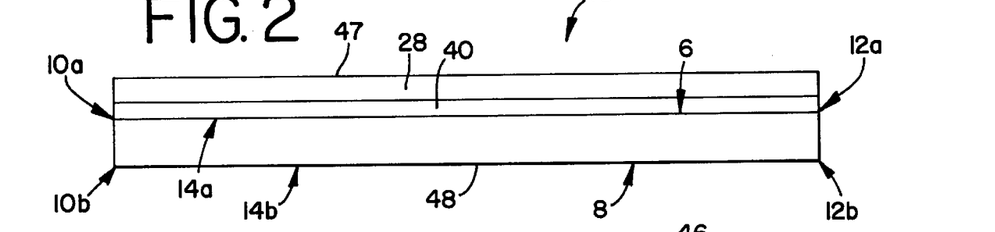
FIG. 2 is a side view of the view of FIG. 1.

A sheet of metal 28 is provided, and the sheet of metal 28 is laid on the layer of adhesive material 40. The sheet of metal can be a sheet of rolled metal foil, preferably a zinc alloy. Other metals or metal alloys can be used, however, as described above. The substrate 4, the layer of adhesive material 40, and the sheet of metal 28 are then laminated together to form a unitary laminated sheet 46 having a metal surface 47 and a substrate surface 48, as shown in FIGS. 1 and 2. The lamination step is performed through known lamination processes with the use of temperature and/or pressure and/or time, or combinations thereof. After lamination, the laminated sheet 46 may then be put through a cold press.

Figure 3:
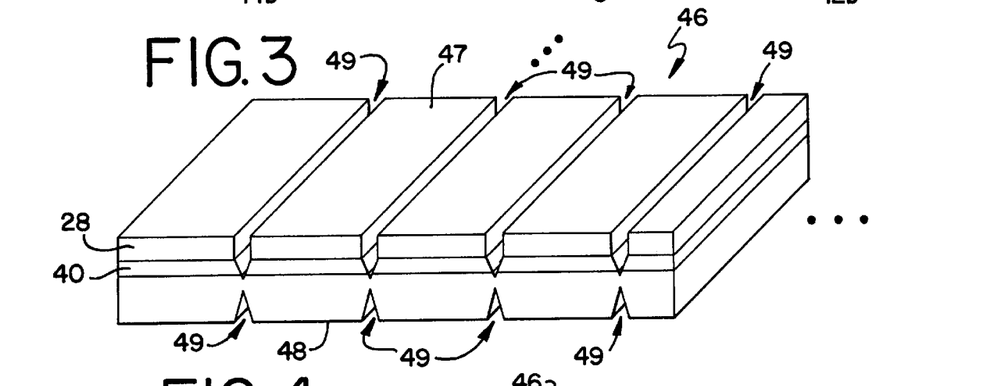
FIG. 3 is a perspective view of the substrate, the sheet of metal, and the layer of adhesive material therebetween from FIG. 1, with scoring lines therein, used to make a surface-mount fuse in accordance with the present invention.
Figure 4:
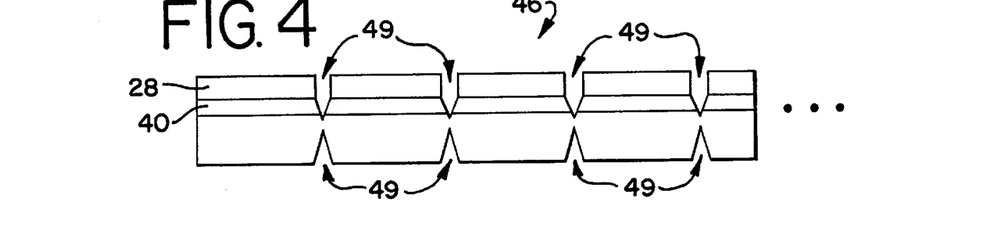
FIG. 4 is a side view of the view of FIG. 3.
Figure 5:
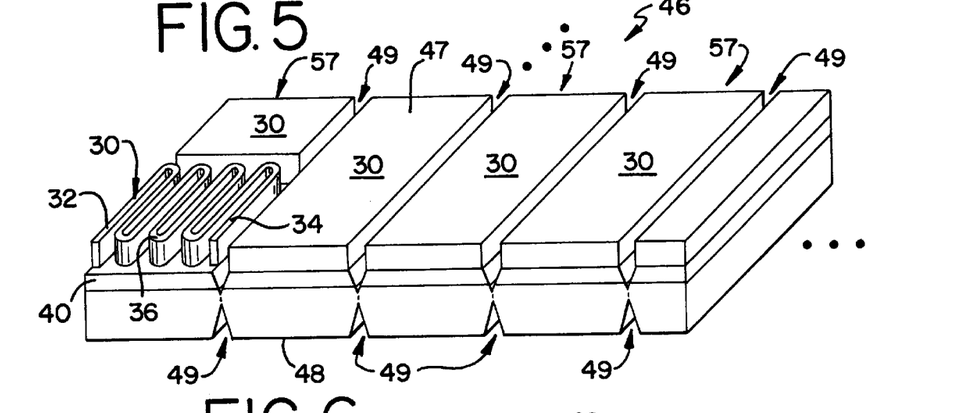
FIG. 5 is a perspective view of the substrate, the sheet of metal, and the layer of adhesive material therebetween, with scoring lines therein, from FIG. 3, shown with one metal strip etched therein, used to make a surface-mount fuse in accordance with the present invention.
Figure 6:
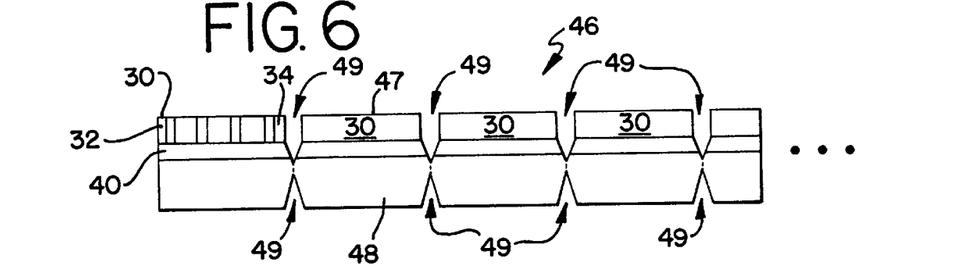
FIG. 6 is a side view of the view of FIG. 5.
Figure 7:
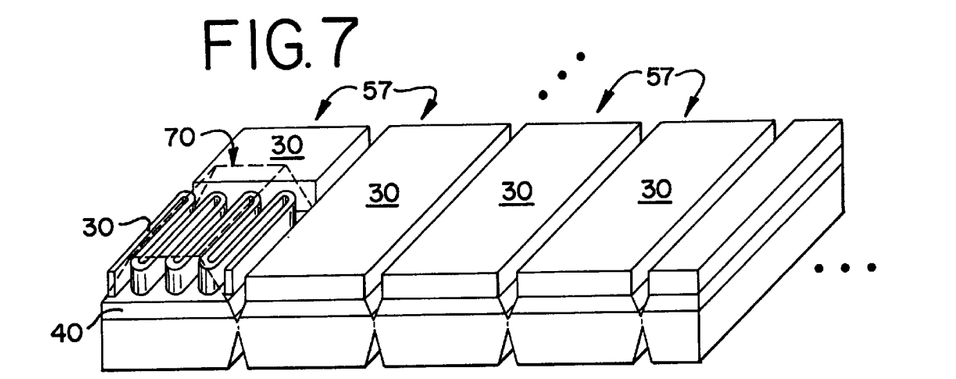
FIG. 7 is a perspective view of the substrate, the metal strip, and the layer of adhesive material therebetween, with scoring lines therein, from FIG. 5, with a protective layer on one of the fuses, used to make a surface-mount fuse in accordance with the present invention.
Figure 8:
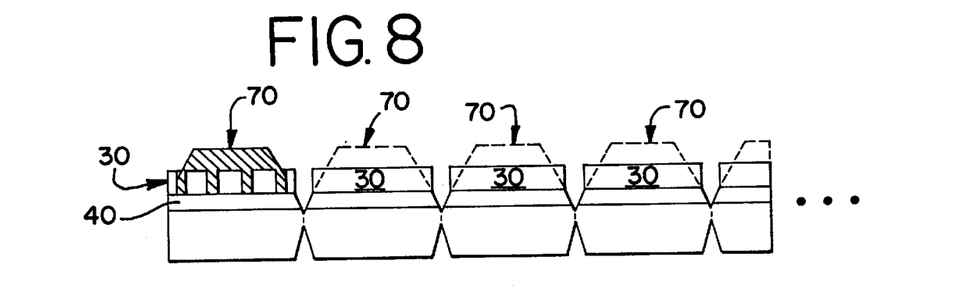
FIG. 8 is a side view of the view of FIG. 5, with the protective layer shown on all of the fuses.

The unitary laminated sheet 46 is then scored on the metal surface 47 and on the substrate surface 48 in substantially parallel columns 49. The scoring allows the unitary laminated sheet 46 to be broken into fuse strip columns 57, each column 57 having a plurality of fuses 2. The scoring step also includes scoring the unitary laminated sheet 46 on the metal surface 47 and on the substrate surface 48 in substantially parallel rows (not shown). The rows are generally perpendicular to the columns 49 and, in combination with the columns, allow the laminated sheet 46 to be broken into individual fuses in a subsequent processing step.

This scoring step can be performed before the following etching step, or afterwards. Scoring is typically less costly than dicing and is, therefore, the preferred way to separate the individual fuses. If ceramics were used as the substrate, then scribing would typically be performed instead of scoring, as is well known in the art. Although this embodiment provides for scoring as a pre-etching step, scoring is preferably performed after etching.

A plurality of patterns (only one is shown in FIGS. 5–10) are then etched into the sheet of metal to form a plurality of unitary metal strips 30 (only one is shown in FIGS. 5–10). As described above, each metal strip 30 has a first connection region 32, a second connection region 34, and a fuse link 36 connecting these two connection regions. The etching is performed through standard etching techniques through the use of photoresist and photolithography, which techniques define and shape the metal strip 30.

Figure 14:
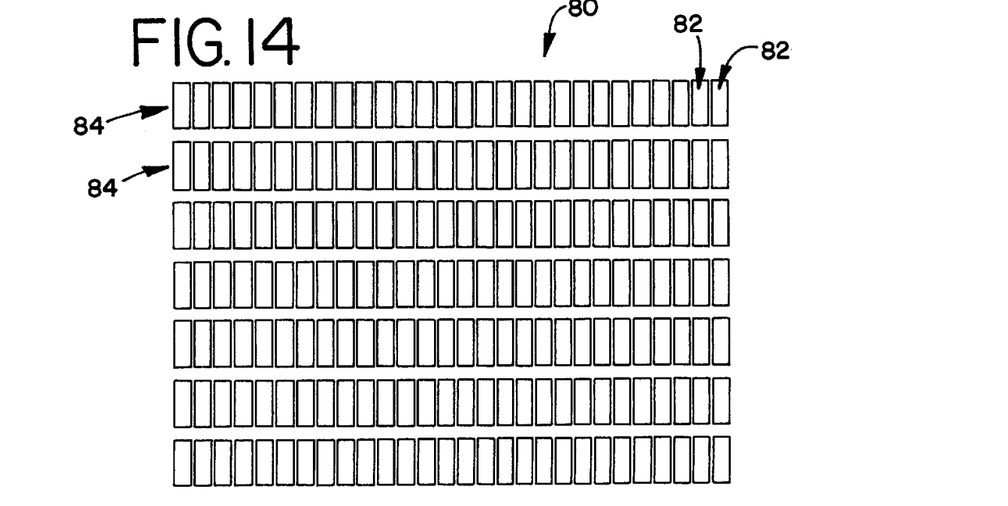
FIG. 14 is top view of one possible stencil used to apply the protective layer within a stencil printing process.

A protective layer 70 is then applied onto each fuse link 36 of each metal strip 30. One method of applying the protective layer 70 is through a stencil printing process with the use of a stencil printing machine. One stencil printing machine which can be used is made by Affiliated Manufacturers, Inc., of Northbranch, N.J., Model No. CP-885. Previous uses of stencil printing machines, for applying protective -coatings on fuses, applied strands of coatings across numerous fuses before the substrate was diced into individual fuses. With the preferred use of the stencil 80 shown in FIG. 14, however, the method of applying protective layer 70 in the present invention comprises applying a protective layer 70 to the individual fuses 2 created from the laminated sheet 46. This stencil 80 has a plurality of grooves 82, one for each protective layer 70 on each fuse 2, for allowing the protective layer material to pass through each groove 82 during stencil printing with the stencil printing machine (not shown). This stencil 80 can be stainless steel and have a thickness of 0.023", but others can be used as well. Using this stencil 80 within the stencil printing machine, the squeegee speed is preferably about 3½"per second for the preferred protective material mentioned above, but can range from about ½–8" per second, depending on the particular material used. Alternatively, the grooves 82 could be opened along stencil rows 84 for applying a protective layer 70 to a full fuse strip column 57. The separation of the fuse strip columns 57 into individual fuses 2 would then separate the protective layer 70. Once the protective layer 70 is applied, the protective layer is cured in open air.

In one form of the present invention, a solder material 60 (solder, solder paste, or flux material) is then applied to each of the first and second connection regions 32, 34. A plurality of first and second terminal leads 50, 52 are then placed on the solder material 60 applied to each of the first and second connection regions 32, 34, respectively. Alignment of the terminal leads 50, 52 may be necessary. The solder material 60 is then reflowed to provide a conductive connection between each of the first and second connection regions 32, 34 of the metal strips 30 and each of the respective first and second terminal leads 50, 52. A cleaning step is usually performed at this point.

Figure 16:
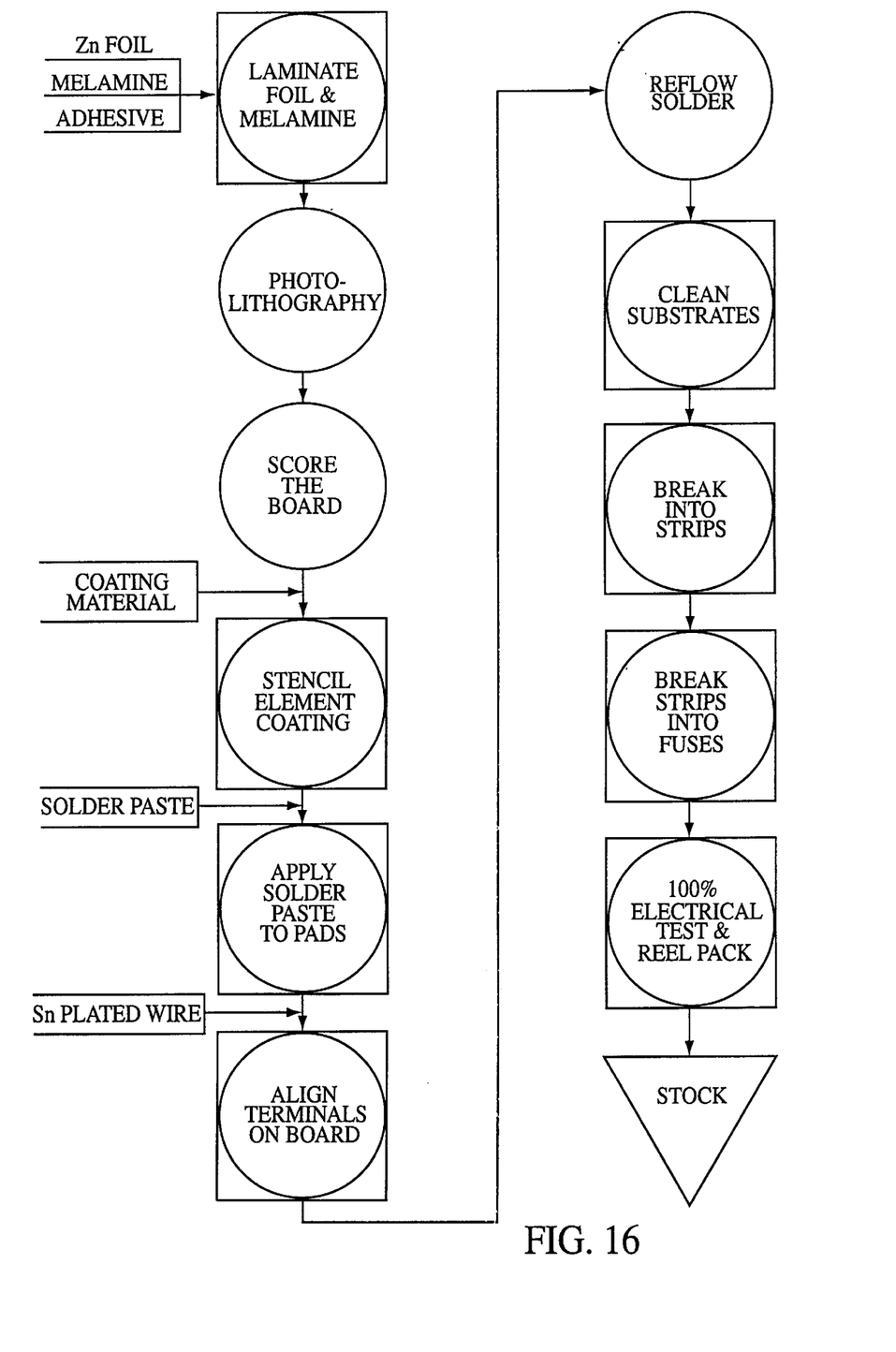
FIG. 16 is a schematic diagram of the process of manufacture of the fuse in accordance with the invention.

The unitary laminated sheet 46 with its plurality of fuses 2 can then be broken, diced, or otherwise separated into fuse strip columns 57, and the fuse strip columns 57 are broken, diced or otherwise separated into individual fuses 2. Testing and packaging is usually then performed. The entire process of manufacture is shown in the schematic diagram, FIG. 16.

Commensurate with one of the alternative apparatus embodiments discussed above, the step of providing an adhesive and laying the adhesive across substantially the entire first surface 6 of the substrate 4 to form a layer of adhesive material 40, is performed as follows. A polymeric material 40 is provided that has first and second polymeric surfaces 42, 44. The first and second polymeric surfaces 42, 44 have an adhesive attached thereto. The first polymeric surface 42 of the polymeric material 40 and the adhesive thereon are attached to the first surface 6 of the substrate 4.

The sheet of metal 28 is laid or placed onto the layer of adhesive material 40 by laying the sheet of metal 28 onto the second polymeric surface 44 of the polymeric material 40 having the adhesive thereon. The step of laminating the substrate 4, the layer of adhesive material 40, and the sheet of metal 28 together to form a unitary laminated sheet 46 having a metal surface 47 and a substrate surface 48 is then performed by laminating the substrate 4, the polymeric material 40 having the adhesive on the first and second polymeric surfaces 42, 44, and the sheet of metal 38 together. As described above, the polymeric material is preferably a polyimide film or material, such as KAPTON, and the sheet of metal 28 is made from a sheet of zinc foil. When the polyimide is laminated to the substrate, the adhesive on the polyimide is actually cured to the substrate, as also takes place with the sheet of metal 28.

In an embodiment mentioned above, which makes use of the clip leads 50', 52', the clip leads 50', 52' are not attached until after the laminated sheet 46 (with other fuse elements, such as the metal strip 30 and protective layer 70) is broken into columns 57 (commonly referred to as "strips"). Once the laminated sheet 46 (with other fuse elements) is broken into columns 57, a solder material is then applied to the connection regions 32', 34'. The clip leads 50', 52' can, alternatively, be provided with solder already existing on the clip leads 50', 52', wherein it is not necessary to apply the solder material directly to the connection regions 32', 34'. The first clip lead 50' is then attached to the substrate 4' and first connection region 32', and the second clip lead 52' is attached to the substrate 4' and second connection region 34', as shown in FIGS. 11–13. A flux material is then applied to the connection regions 32', 34' and surrounding area of the terminal connections between the clip leads 50', 52'. The solder is then reflowed to create a conductive connection. The steps of the clip lead attachment (with solder already existing on the clip leads 50', 52' or already existing on the connection regions 32', 34'), the flux material application, and the reflowing of the solder, alternatively, can all be preformed in one operation. In this one step operation, each column 57 is inserted into a lead-insertion-attachment-reflow machine which first inserts or attaches the clip leads 50', 52' onto the sides 18', 20' of the individual fuses 2' of the column 57. The clip leads 50', 52' can be pre-solder laden and pre-flux laden such that the next step in the process is only reflowing the solder and flux so that the leads 50', 52' are permanently attached to the sides 18', 20' of each fuse 2' and the respective connection regions 32', 34' of the metal strips 30 on the column 57. One significant advantage of this step is that the lead insertion and the reflow both occur in one step with the use of the lead-insertion-reflow machine. One source of this type of machine is NAS Corporation. U.S. Pat. Nos. 4,120,558, 4,203,648 and 4,605,278 are incorporated herein by reference for additional disclosure when these steps are used during manufacture. These types of clip leads or lead frames can be obtained from North American Specialties Corporation (NAS), 120-12 28th Avenue, Flushing, N.Y.

Once this operation (or steps) is performed, a cleaning step is then performed, and the columns 57 are broken into individual fuses. The fuses are then tested, packaged, and ready for placement into circuit boards.

It should be understood that the present invention can include a substrate 4 having drilled or punched holes or bores (not shown) for attaching metallization to create the terminal leads 50, 52 (although not shown in this form). It should be further noted that the bores would be lined up into rows and columns, disposed over almost the entire substrate, typically two half bores per fuse 2. When the drilling or punching of the bores has been completed, the bored substrate 4 is then processed in a similar manner as described above. A conductive metal can then be placed in a notched section (half holes) conductively connected to the metal strip 30. As a result of this flexibility, specific electrical characteristics can be engineered into the fuse to meet varying needs of the ultimate user.

While the specific embodiments have been illustrated and described, numerous modifications come to mind without significantly departing from the spirit of the invention, and the scope of protection is only limited by the scope of the accompanying Claims.

What is claimed is:

1. A substrate having first and second surfaces, each surface having first, second, third, and fourth ends, the substrate also having first, second, third, and fourth sides;
   a metal strip evenly attached to the first surface of the substrate with a laminating adhesive, the laminating adhesive being disposed between the metal strip and the first surface of the substrate, the metal strip having a first connection region, a second connection region, and a fuse link therebetween having an upper surface and a side surface, the first connection region being disposed along substantially the full length of the first end of the first surface of the substrate, the second connection region being disposed along substantially the full length of the second end of the first surface of the substrate; and
   first and second leads aligned substantially with and along the first and second connection regions, respectively, the first lead being conductively connected to the first connection region and horizontally projecting away from the first connection region, the second lead being conductively connected to the second connection region and horizontally projecting away from the second connection region, for connecting the fuse to the remainder of the circuit.

2. The surface-mount fuse of claim 1, wherein a protective layer is disposed on the fuse link, the protective layer being in contact with and surrounding the upper and side surfaces of the fuse link of the metal strip.

3. The surface-mount fuse of claim 2, wherein the protective layer is also in contact with at least a fraction of the first and second connection regions of the metal strip.

4. The surface-mount fuse of claim 2, wherein said protective layer is made of a polymeric material.

5. The surface-mount fuse of claim 2, wherein the protective layer is made of an RTV silicone material.

6. The surface-mount fuse of claim 2, wherein a solder material is disposed between the first and second leads and the first and second connection regions, respectively, of the metal strip for connecting the first and second leads to the first and second connection regions.

7. The surface-mount fuse of claim 1, wherein the substrate is made of an FR-4 material.

8. The surface-mount fuse of claim 1, wherein the substrate is made of a melamine-based composition.

9. The surface-mount fuse of claim 8, wherein the melamine-based composition is a type G-5 melamine laminate.

10. The surface-mount fuse of claim 1, wherein the metal strip is made from a zinc alloy.

11. The surface-mount fuse of claim 1, wherein the metal strip is made from a sheet of zinc foil.

12. The surface-mount fuse of claim 1, wherein the laminating adhesive is a blended silicone laminating adhesive.

13. The surface-mount fuse of claim 12, wherein the laminating adhesive has a high viscosity at room temperature.

14. The surface-mount fuse of claim 1, wherein the first and second leads are made of wire.

15. A surface-mount fuse for protecting a circuit including the fuse comprising:
    a substrate having a first surface;
    a metal strip evenly attached to the first surface of the substrate with a silicone laminating adhesive, the silicone laminating adhesive being disposed between the metal strip and the first surface of the substrate and connecting the substrate to the metal strip, wherein the metal strip has a first connection region, a second connection region, and a fuse link therebetween having an upper surface and a side surface, the first connection region being disposed along substantially the full length of the first end of the first surface of the substrate, the second connection region being disposed along substantially the full length of the second end of the first surface of the substrate;
    a first terminal lead being conductively connected to the first connection region and projecting away from the first connection region; and
    a second terminal lead being conductively connected to the second connection region and projecting away from the second connection region, the first and second terminal leads connecting the fuse to the remainder of the circuit.

16. The surface-mount fuse of claim 15, wherein a protective layer is disposed on the fuse link, the protective layer in contact with and surrounding the upper and side surfaces of the fuse link of the metal strip.

17. The surface-mount fuse of claim 16, wherein the protective layer is also in contact with at least a fraction of the first and second connection regions of the metal strip.

18. The surface-mount fuse of claim 16, wherein said protective layer is made of a polymeric material.

19. The surface-mount fuse of claim 16, wherein the protective layer is made of an RTV silicone material.

20. The surface-mount fuse of claim 16, wherein a solder material is disposed between the first and second terminal leads and the first and second connection regions, respectively, of the metal strip for connecting the first and second terminal leads to the first and second connection regions.

21. The surface-mount fuse of claim 15, wherein the substrate is made of an FR-4 material.

22. The surface-mount fuse of claim 15, wherein the substrate is made of a melamine-based composition.

23. The surface-mount fuse of claim 22, wherein the melamine-based composition is a type G-5 melamine laminate.

24. The surface-mount fuse of claim 15, wherein the metal strip is made from a zinc alloy.

25. The surface-mount fuse of claim 15, wherein the metal strip is made from a sheet of zinc foil.

26. The surface-mount fuse of claim 15, wherein the layer of polymeric material is a polyimide.

27. The surface-mount fuse of claim 15, wherein the silicone laminating adhesive is a two-component blended material.

28. A surface-mount fuse for protecting a circuit including the fuse comprising:
    a substrate having first and second surfaces, each surface having first, second, third, and fourth ends, the substrate also having first, second, third, and fourth sides;

a laminating adhesive disposed on the first surface of the substrate;

a metal strip evenly attached to the laminating adhesive on the first surface of the substrate, the metal strip having a first connection region, a second connection region, and a fuse link therebetween having an upper surface and a side surface, the first connection region being disposed along substantially the full length of the first end of the first surface of the substrate, the second connection region being disposed along substantially the full length of the second end of the first surface of the substrate;

a first clip lead having at least one clip, each clip of the first clip lead having a mounting portion and a wrap-around portion, the wrap-around portion of each clip being aligned generally along the first connection region and first side of the substrate, and being conductively connected to the first connection region, wherein the wrap-around portion of each clip fastens the first clip lead to the substrate and first connection region, wherein the mounting portion of the first clip lead projects away from the first connection region; and a second clip lead having at least one clip, each clip of the second clip lead having a mounting portion and a wrap-around portion, the wrap-around portion of each clip being aligned generally along the second connection region and second side of the substrate, and being conductively connected to the second connection region, wherein the wrap-around portion of each clip fastens the second clip lead to the substrate and second connection region, wherein the mounting portion of the second clip lead projects away from the second connection region, the first and second clip leads connecting the fuse to the remainder of the circuit.

29. The surface-mount fuse of claim 28, wherein a protective layer is disposed on the fuse link, the protective layer being in contact with and surrounding the upper and side surfaces of the fuse link of the metal strip.

30. The surface-mount fuse of claim 29, wherein the protective layer is also in contact with at least a fraction of the first and second connection regions of the metal strip.

31. The surface-mount fuse of claim 29, wherein said protective layer is made of a polymeric material.

32. The surface-mount fuse of claim 29, wherein the protective layer is made of an RTV silicone material.

33. The surface-mount fuse of claim 28, wherein the substrate is made of an FR-4 material.

34. The surface-mount fuse of claim 28, wherein the substrate is made of a melamine-based composition.

35. The surface-mount fuse of claim 34, wherein the melamine-based composition is a type G-5 melamine laminate.

36. The surface-mount fuse of claim 28, wherein a solder material is disposed between the first and second clip leads and the first and second connection regions, respectively, of the metal strip for conductively connecting the first and second clip leads to the first and second connection regions.

37. The surface-mount fuse of claim 28, wherein the metal strip is made from a zinc alloy.

38. The surface-mount fuse of claim 28, wherein the metal strip is made from a sheet of zinc foil.

39. The surface-mount fuse of claim 28, wherein the laminating adhesive is a silicone laminating adhesive.

40. A surface-mount fuse for protecting a circuit including the fuse comprising:

a substrate having first and second surfaces, each surface having first, second, third, and fourth ends, the substrate also having first, second, third, and fourth sides;

a laminating adhesive disposed on the first surface of the substrate;

a metal strip evenly attached to the first surface of the substrate by the laminating adhesive, wherein the metal strip has a first connection region, a second connection region, and a fuse link therebetween having an upper surface and a side surface, the first connection region being disposed along substantially the full length of the first end of the first surface of the substrate, the second connection region being disposed along substantially the full length of the second end of the first surface of the substrate;

a first terminal lead conductively connected to the first connection region; and a second terminal lead conductively connected to the second connection region, the first and second terminal leads connecting the fuse to the remainder of the circuit.

41. The surface-mount fuse of claim 40, wherein the laminating adhesive is a silicone laminating adhesive.

42. The surface-mount fuse of claim 40, wherein the laminating adhesive is a blended silicone laminating adhesive.

43. The surface-mount fuse of claim 40, wherein the substrate is made of a type G-5 melamine laminate.

* * * * *